United States Patent
Yoo et al.

(10) Patent No.: US 10,164,217 B2
(45) Date of Patent: Dec. 25, 2018

(54) METHOD OF MANUFACTURING ARRAY SUBSTRATE HAVING OLED CONNECTED TO TFT SUBSTRATE WITH A CONDUCTIVE BRIDGE

(71) Applicant: BOE TECHNOLOGY GROUP CO., LTD., Beijing (CN)

(72) Inventors: Seongyeol Yoo, Beijing (CN); Seungjin Choi, Beijing (CN); Heecheol Kim, Beijing (CN); Youngsuk Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 63 days.

(21) Appl. No.: 14/418,007

(22) PCT Filed: Mar. 31, 2014

(86) PCT No.: PCT/CN2014/074382
§ 371 (c)(1),
(2) Date: Jan. 28, 2015

(87) PCT Pub. No.: WO2015/096292
PCT Pub. Date: Jul. 2, 2015

(65) Prior Publication Data
US 2015/0325630 A1    Nov. 12, 2015

(30) Foreign Application Priority Data
Dec. 26, 2013   (CN) .......................... 2013 1 0741176

(51) Int. Cl.
*H01L 51/56* (2006.01)
*H01L 27/32* (2006.01)
(Continued)

(52) U.S. Cl.
CPC .............. *H01L 51/56* (2013.01); *H01L 21/77* (2013.01); *H01L 27/326* (2013.01);
(Continued)

(58) Field of Classification Search
CPC .............. H01L 21/77; H01L 2227/323; H01L 2251/5323; H01L 27/3248; H01L 27/326;
(Continued)

(56) References Cited

U.S. PATENT DOCUMENTS 7,501,756 B2    3/2009   Kim et al.
7,893,438 B2    2/2011   Kim et al.
(Continued)

FOREIGN PATENT DOCUMENTS

CN    1610461 A    4/2005
CN    1736133 A    2/2006
(Continued)

OTHER PUBLICATIONS

Chinese Office Action of Chinese Application No. 201310741176.8, dated Nov. 27, 2015 with English translation.
(Continued)

*Primary Examiner* — Michael Jung
(74) *Attorney, Agent, or Firm* — Collard & Roe, P.C.

(57) ABSTRACT

An array substrate, a manufacturing method thereof and a display device are provided. The array substrate comprises a base substrate (1), an organic light-emitting diode (OLED) device and a thin-film transistor (TFT) structure, the OLED device disposed on one side of the base substrate (1); the TFT structure disposed on the other side of the base substrate (1); a through hole formed on the base substrate and provided with a conductive bridge (2); and the OLED device connected with the TFT structure through the conductive bridge (2). The array substrate can avoid electrical interference of the TFT structure on the OLED device, and hence
(Continued)

accurate drive for the OLED device can be achieved; as the OLED device can be directly formed on a surface of the base substrate, surface treatment of a pixel electrode is saved with respect to conventional OLED display device, and hence manufacturing process can be accelerated and manufacturing cost can be reduced; and as both an anode and a cathode of the OLED device are made from transparent materials, double-sided light emission can be achieved in the array substrate, and hence double-sided display can be achieved in the array substrate.

4 Claims, 3 Drawing Sheets

(51) Int. Cl.
  *H01L 51/52* (2006.01)
  *H01L 29/786* (2006.01)
  *H01L 21/77* (2017.01)
  *H01L 29/417* (2006.01)

(52) U.S. Cl.
  CPC ...... *H01L 27/3248* (2013.01); *H01L 27/3251* (2013.01); *H01L 27/3253* (2013.01); *H01L 29/41733* (2013.01); *H01L 29/78606* (2013.01); *H01L 51/5206* (2013.01); *H01L 51/5234* (2013.01); *H01L 2227/323* (2013.01); *H01L 2251/5323* (2013.01)

(58) Field of Classification Search
  CPC ........... H01L 29/78606; H01L 51/5206; H01L 51/5234; H01L 51/56; H01L 27/3253; H01L 27/3251
  USPC ................. 257/79–103; 438/28–29, 34–38
  See application file for complete search history.

(56) References Cited

U.S. PATENT DOCUMENTS

| | | | |
|---|---|---|---|
| 7,973,475 B2 | 7/2011 | Kim et al. | |
| 2002/0196402 A1 | 12/2002 | Sanford et al. | |
| 2003/0205968 A1* | 11/2003 | Chae | G09G 3/32 313/500 |
| 2004/0081852 A1 | 4/2004 | Chen et al. | |
| 2004/0145858 A1* | 7/2004 | Sakurada | H05K 3/4647 361/600 |
| 2006/0128250 A1 | 6/2006 | Kim et al. | |
| 2008/0090341 A1* | 4/2008 | Tanaka | G02F 1/136227 438/158 |
| 2009/0128014 A1* | 5/2009 | Kitazume | H01L 51/5231 313/504 |
| 2009/0278452 A1 | 11/2009 | Kim | |
| 2010/0155578 A1* | 6/2010 | Matsumoto | H01L 27/14632 250/216 |
| 2011/0048619 A1* | 3/2011 | Meinders | H05K 3/4635 156/184 |
| 2011/0101346 A1* | 5/2011 | Tateishi | H01L 27/12 257/43 |
| 2011/0147769 A1 | 6/2011 | Kang et al. | |
| 2012/0220085 A1 | 8/2012 | Yoon et al. | |
| 2013/0001577 A1* | 1/2013 | Kim | H01L 29/45 257/71 |
| 2013/0050067 A1* | 2/2013 | Yamashita | G09G 3/3233 345/76 |
| 2014/0061606 A1* | 3/2014 | Kim | H01L 23/48 257/40 |
| 2014/0167000 A1* | 6/2014 | Jeon | H01L 27/3248 257/40 |
| 2014/0186978 A1* | 7/2014 | Kang | H01L 27/3246 438/23 |
| 2014/0239262 A1* | 8/2014 | Kim | H01L 51/5212 257/40 |
| 2014/0326963 A1* | 11/2014 | Yang | H01L 51/56 257/40 |
| 2015/0029429 A1* | 1/2015 | Choi | G02F 1/1368 349/43 |

FOREIGN PATENT DOCUMENTS

| | | |
|---|---|---|
| CN | 200969358 A | 10/2007 |
| CN | 101221977 A | 7/2008 |
| CN | 101615625 A | 12/2009 |
| CN | 101616518 A | 12/2009 |
| CN | 101853104 A | 10/2010 |
| CN | 102110706 A | 6/2011 |
| CN | 103474448 A | 12/2013 |
| CN | 103474453 A | 12/2013 |
| WO | 2015/096292 A1 | 7/2015 |

OTHER PUBLICATIONS

International Search Report and Written Opinion of the International Searching Authority with Notice of Transmittal of the International Search Report and Written Opinion of PCT/CN2014/074382 in Chinese, dated Sep. 29, 2014.

English translation of the International Preliminary Report on Patentability and Written Opinion of the International Searching Authority of PCT/CN2014/074382, dated Jun. 28, 2016.

International Search Report of PCT/CN2014/074382 in Chinese, dated Sep. 29, 2014 with English translation.

Written Opinion of the International Searching Authority of PCT/CN2014/074382 in Chinese, dated Sep. 29, 2014 with English translation.

\* cited by examiner

METHOD OF MANUFACTURING ARRAY SUBSTRATE HAVING OLED CONNECTED TO TFT SUBSTRATE WITH A CONDUCTIVE BRIDGE

CROSS REFERENCE TO RELATED APPLICATIONS

This application is the National Stage of PCT/CN2014/074382 filed on Mar. 31, 2014, which claims priority under 35 U.S.C. § 119 of Chinese Application No. 201310741176.8 filed on Dec. 26, 2013, the disclosure of which is incorporated by reference.

TECHNICAL FIELD

Embodiments of the present invention relate to the field of display technology, in particular to an array substrate, a manufacturing method thereof and a display device.

BACKGROUND

Compared with cathode ray tube (CRT) displays or thin film transistor-liquid crystal displays (TFT-LCDs), organic light-emitting diode (OLED) displays have the characteristics of being lighter and thinner appearance design, wider viewing angle, faster response, lower power consumption and the like, and hence have been much concerned as the next-generation display device.

An OLED device is a self-luminous device and generally comprises a cathode, an anode arranged opposite to the cathode, and an organic light emitting layer disposed between the cathode and the anode. When the OLED device operates, a voltage is applied between the cathode and the anode so as to generate an electric field at both ends of the organic light emitting layer disposed between the cathode and the anode, and hence electrons and holes can be recombined with each other in the organic light emitting layer and hence light emits. Display effect of the OLED display device can be controlled by controlling the voltages applied to pixel electrodes via an array substrate with circuit units.

In conventional techniques, an OLED display device comprises an OLED device and a thin-film transistor (TFT) array substrate. An organic light emitting layer of the OLED device is disposed on a surface of a pixel electrode of the TFT array substrate. The pixel electrode can be used as a cathode or an anode of the OLED device. Under influence of capacitance and a magnetic field due to currents in the TFT structure, the light-emitting effect of the light emitting layer is poor. Moreover, as the pixel electrode of the TFT structure has a rough surface, a base of the pixel electrode should be subject to surface treatment before coating a light emitting layer, and hence the manufacturing process is complicated and the cost increases.

SUMMARY

In view of this, one object of the embodiment of the present disclosure is to provide an array substrate, a manufacturing method thereof and a display device, in which the light-emitting effect of an OLED device is not affected by the electrical interference of a TFT structure. The method for manufacturing the array substrate can improve yield and reduce manufacturing cost.

The object is achieved by a technical solution according to an embodiment of the present invention: an array substrate, comprising a base substrate, an OLED device, and a TFT structure, the OLED device disposed on one side of the base substrate, the TFT structure disposed on the other end of the base substrate, and the OLED device connected with the TFT structure.

According to an embodiment of the present invention, a through hole is formed on the base substrate and provided with a conductive bridge, and the OLED device is connected with the TFT structure through the conductive bridge.

According to an embodiment of the present invention, the array substrate further comprises a conductive bridge extension disposed on the side of the base substrate provided with the TFT structure and formed integrally with the conductive bridge, the TFT structure connected with the OLED device through the conductive bridge extension and the conductive bridge.

According to an embodiment of the present invention, the conductive bridge is made from organic conductive resin.

According to an embodiment of the present invention, the TFT structure comprises a barrier layer and a barrier layer through hole which are disposed on the base substrate provided with the conductive bridge extension; the TFT structure further comprises source/drain electrodes, a semiconductor layer, a gate insulating layer, a gate electrode and a passivation layer, which are formed on the barrier layer in sequence along a direction away from the base substrate; and the drain electrode of the TFT structure is connected with the conductive bridge extension by running though the barrier layer through hole.

According to an embodiment of the present invention, the OLED device comprises an anode, a luminous sheet and a cathode, the anode or the cathode is connected with the TFT structure through the conductive bridge.

According to an embodiment of the present invention, both the anode and the cathode are made from transparent conductive material.

And further, the luminous sheet is disposed between the anode and the cathode, and does not overlap the source/drain electrodes and the gate electrode in a direction perpendicular to the base substrate.

According to another aspect of the present invention, a method for manufacturing an array substrate is provided, comprising:

Forming a through hole on a base substrate which passes through the base substrate, and forming a conductive bridge in the through hole;

forming a TFT structure on one side of the base substrate; and forming an OLED device on the other side of the base substrate, and connecting the OLED device with the TFT structure through the conductive bridge.

According to an embodiment of the invention, the method further comprises:

forming a conductive bridge extension on the side of the base substrate provided with the TFT structure, the conductive bridge extension and the conductive bridge formed integrally.

According to one embodiment of the invention, forming a TFT structure on one side of the base substrate comprises:

forming a barrier layer on a surface of the base substrate provided with the conductive bridge extension, and forming a through hole in the barrier layer;

forming source/drain electrodes on the barrier layer, the drain electrode connected electrically with the conductive bridge extension via the through hole; and forming a semiconductor layer, a gate insulating layer, a gate electrode and a passivation layer on the source/drain electrodes in sequence.

According to an embodiment of the invention, forming a through hole on a base substrate which passes through the base substrate comprising:

performing photoresist coating, exposing and developing on both surfaces of the base substrate in sequence, thereby forming a photoresist layer on both surfaces of the base substrate respectively, in which patterns of holes with same dimension are formed at corresponding positions; and etching the base substrate and removing the photoresist, thereby forming a through hole perpendicular to the surface of the base substrate.

According to an embodiment of the invention, the method comprises the following after etching the base substrate:

Adding a hydrofluoric acid solution to the surface of the base substrate, so as to etch the base substrate.

According to an embodiment of the invention, forming a through hole on a base substrate which passes through the base substrate comprises:

forming a through hole on the base substrate which passes through the base substrate, by laser boring.

According to an embodiment of the invention, forming an OLED device on the other side of the base substrate, and connecting the OLED device with the TFT structure through the through hole comprises:

forming a cathode on a surface of the base substrate, the cathode connected with the TFT structure via the conductive bridge, and forming a luminous sheet and an anode on the cathode in sequence;

or forming an anode on a surface of the base substrate, the anode connected with the TFT structure via the conductive bridge, and forming a luminous sheet and a cathode on the anode in sequence, According to still another aspect of the invention, a display device is provided, comprising the array substrate mentioned above.

Compared with conventional technologies and products, embodiments of the present invention have the following advantages:

1. In the embodiments of the present invention, a through hole is formed on the base substrate; the OLED device and the TFT structure are respectively disposed on each side of the base substrate and connected with each other via the through hole; the base substrate separates the OLED device from the TFT structure and increases the distance between the OLED device and the TFT structure; electrical interference of the TFT structure on the OLED device is reduced; and hence accurate drive for the OLED device by the TFT structure can be guaranteed.

2. In the embodiments of the present invention, the OLED device is directly formed on the surface of the base substrate, surface treatment of the pixel electrode is saved, and hence the manufacturing process is accelerated and the manufacturing cost is reduced with respect to conventional OLED display devices.

3. As both the anode and the cathode of the OLED device according to the embodiments of the present invention are made from transparent material, the array substrate can achieve double-sided light emission can be achieved in the array substrate, and hence the double-sided display can be achieved in the array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
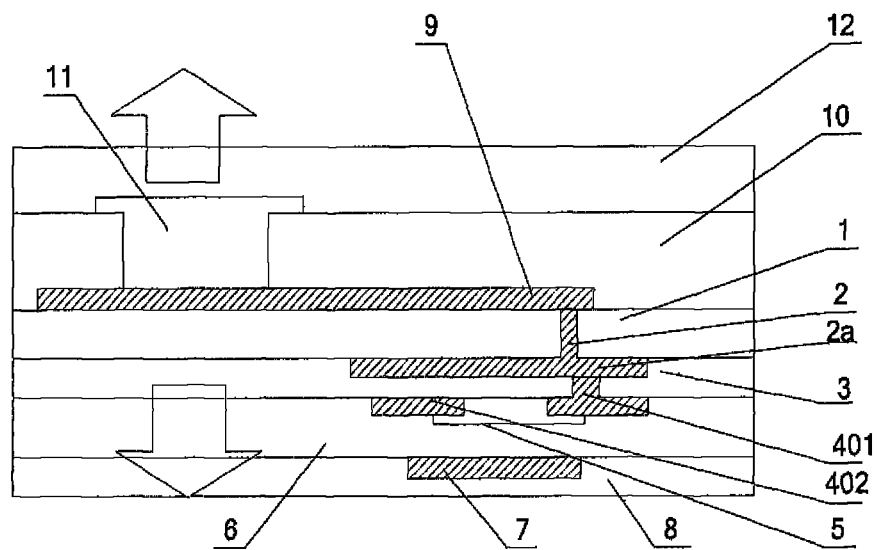
FIG. 1 is a view illustrating a schematic structure of an array substrate according to an embodiment of the present invention.

As illustrated in FIG. 1, one embodiment of the present invention provides an array substrate. The array substrate comprises a base substrate 1, an OLED device and a TFT structure. The OLED device is disposed on one side of the base substrate 1; the TFT structure is disposed on the other side of the base substrate 1; a through hole is formed on the base substrate 1 and provided with a conductive bridge 2; and the OLED device is connected with the TFT structure through the conductive bridge 2. The OLED device comprises an anode 12, a luminous sheet 11, an insulating layer 10 and a cathode 9 arranged in sequence, wherein the anode 12 is connected with the TFT structure through the conductive bridge; and the luminous sheet 11 comprises a hole injection layer, a hole transport layer, an organic light emitting layer, an electron transport layer and an electron injection layer. Of course, the position of the cathode and the position of the anode in the OLED device can be interchanged, and the cathode is connected with the TFT structure through the conductive bridge, The base substrate 1 separates the OLED device from the TFT structure and increases the distance between the OLED device and the TFT structure, so as to reduce the electrical interference of the TFT structure on the OLED device and guarantee the accurate driving for the OLED device by the TFT structure.

Further, the array substrate further comprises a conductive bridge extension 2a which is disposed on the side of the base substrate 1 provided with the TFT structure and formed integrally with the conductive bridge 2. The TFT structure is connected with the OLED device through the conductive bridge 2 and the conductive bridge extension 2a.

In the embodiment, the conductive bridge 2 is made from organic conductive resin.

As illustrated in FIG. 1, the TFT structure comprises a barrier layer 3 and a barrier layer through hole which are disposed on the side of the base substrate 1 provided with the conductive bridge extension 2a. The TFT structure further comprises source/drain electrodes 401 and 402, a semiconductor layer 5, a gate insulating layer 6, a gate electrode 7 and a passivation layer 8, which are formed on the barrier layer 3 in sequence along a direction away from the base substrate 1. The drain electrode 401 of the TFT structure passes through the through hole in the barrier layer 3 and is electrically connected with the conductive bridge extension 2a.

It should be noted that description is given in the embodiment of the present invention by taking a top-gate TFT structure as an example and embodiments of the present invention are not limited thereto. Apart from the top-gate TFT structure, TFT structures of other types, e.g., bottom-gate or side-gate TFT structures, are all applicable to the proposals of the embodiments of the present invention as long as signals form the drain electrode of the TFT structure are transmitted to the OLED device on the other side of the substrate via a through hole of the substrate. Specific TFT structures can have different structures according to various embodiments. No further description will be given here one by one.

The semiconductor layer 5 can be made from materials such as amorphous silicon, low-temperature polysilicon and oxide semiconductor. In the embodiment, the semiconductor layer 5 can be made from materials such as indium gallium zinc oxide (IGZO) and indium tin zinc oxide (ITZO).

And further, in the OLED device, both the anode 12 and the cathode 9 are made from transparent conductive material such as indium tin oxide (ITO) and indium zinc oxide (IZO), such that double-sided light emission can be achieved in the OLED device. And furthermore, the base substrate 1 is made from a transparent material; and the barrier layer 3 and the gate insulating layer 6 are usually made from silicon nitride and can also be made from silicon oxide, silicon oxynitride, organic resin or the like. As illustrated in FIG. 1, the luminous sheet 11 is disposed at a position, not overlapping with the source electrode 401, the drain electrode 402 and the gate electrode 7, in a direction perpendicular to the surface of the base substrate 1. Light emitted from the luminous sheet 11 can transmit through the substrate 1, the barrier layer 3, the gate insulating layer 6 and the passivation layer 8. Thus, double-sided light emission can be achieved in the array substrate, and hence the double-sided display can be achieved in the array substrate. An organic light emitting layer in the luminous sheet 11 adopts an electroluminescent (EL) sheet. The EL sheet is a device in which electric energy is converted into optical energy. As the EL sheet will not produce heat in its operation, the EL sheet has the advantages of light weight, simple and convenient installation, freely detachable, good reusability, low carbon, energy saving, friend to environment, and uniquely novel, fashion and dynamic.

As illustrated in FIG. 1, the OLED device comprises an anode 12, a luminous sheet 11 and a cathode 9 arranged in sequence from the top down. The cathode 9 is connected with the drain electrode 401 of the TFT structure by means of the conductive bridge 2.

Or the OLED device comprises a cathode, a luminous sheet and an anode arranged in sequence from the top down. The anode is connected with the drain electrode of the TFT structure by means of the conductive bridge.

In the embodiment of the present invention, the through hole is formed on the base substrate and provided with the conductive bridge; such that the OLED device and the TFT structure are respectively disposed on each side of the base substrate and connected with each other through the conductive bridge; the base substrate separates the OLED device from the TFT structure and increases the distance between the OLED device and the TFT structure; and thereby electrical interference of the TFT structure on the OLED device is reduced and the accurate drive for the OLED device by the TFT structure is guaranteed. In addition, as both the anode and the cathode of the OLED device according to the embodiment of the present invention are made from transparent material, double-sided light emission can be achieved in the array substrate, and hence the double-sided display can be achieved in the array substrate.

Another embodiment of the present invention further provides a method for manufacturing an array substrate, which comprises the following steps:

forming a through hole on a base substrate which passes through the base substrate, and forming a conductive bridge in the through hole;

forming a TFT structure on one side of the base substrate; and forming an OLED device on the other side of the base substrate, the OLED device to be connected with the TFT structure through the conductive bridge.

The array substrate according to the embodiment of the present invention can be manufactured by patterning processes which refer to partial or all steps such as film forming, photoresist coating, exposing, developing, etching and etc.

Next, detailed description will be given to the steps for manufacturing the array substrate with reference to FIGS. 2 to 9.

The method for manufacturing the array substrate, according to an embodiment of the present invention, comprises:

Step S1: forming a through hole on a base substrate which passes through the base substrate, and forming a conductive bridge in the through hole.

Figure 2:
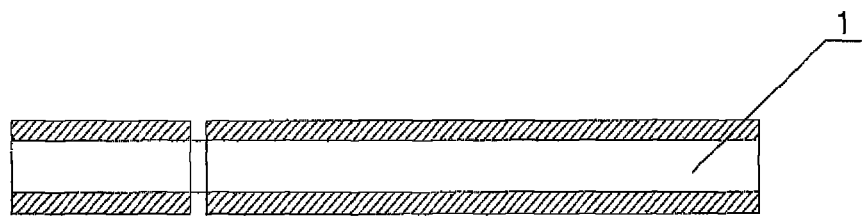
FIG. 2 is view 1 illustrating a schematic structure of a device in the method for manufacturing the array substrate, according to an embodiment of the present invention.
Figure 3:
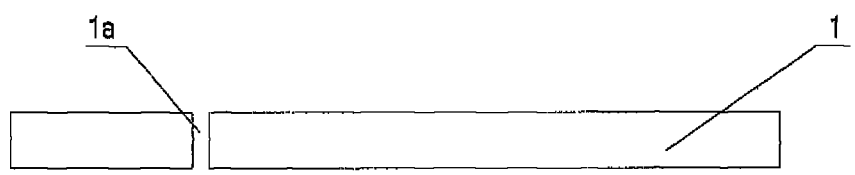
FIG. 3 is view 2 illustrating a schematic structure of the device in the method for manufacturing the array substrate, according to an embodiment of the present invention.

Both surfaces of the base substrate 1 are subject to photoresist coating, exposing and developing respectively. As illustrated in FIG. 2, a photoresist layer having holes with same dimension at corresponding positions is respectively formed on each surface of the base substrate. Subsequently, the base substrate 1 is etched and the photoresist layer is removed. As illustrated in FIG. 3, a through hole 1a is formed in a direction perpendicular to the surface of the base substrate, Moreover, if a hydrofluoric acid solution is added to the surface of the base substrate 1 and the base substrate 1 is etched subsequently, thus, the base substrate can be easily bored and the manufacturing process can be accelerated.

In addition, in the step, the through hole passing through the base substrate can also be formed on the base substrate by laser boring.

Figure 4:
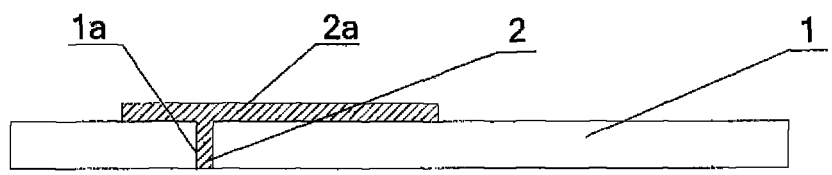
FIG. 4 is view 3 illustrating a schematic structure of the device in the method for manufacturing the array substrate, according to an embodiment of the present invention.

Subsequently, the base substrate 1 is cleaned, and organic conductive resin material is formed in the through hole of the base substrate 1. As illustrated in FIG. 4, organic conductive resin material is also deposited in the through hole 1a of the base substrate 1, and the conductive bridge 2 is formed.

Step S2: as illustrated in FIG. 4, forming a conductive bridge extension 2a on one side of the base substrate 1, the conductive bridge extension 2a and the conductive bridge 2 formed integrally.

Organic conductive resin material is deposited on one side of the base substrate 1. The organic conductive resin is semifluid. The organic conductive resin deposited on the substrate flows into and fills the through hole 1a; and hence the conductive bridge 2 is formed. The base substrate deposited with the organic conductive resin is subject to patterning processes, and the conductive bridge extension 2a is formed.

Step S3: forming a TFT structure on the surface of the base substrate 1 provided with the conductive bridge extension 2a, the TFT structure electrically connected with the conductive bridge extension 2a.

A barrier layer 3 is formed on the surface of the base substrate 1 provided with the conductive bridge extension 2a, and a through hole is formed in the barrier layer 3. Subsequently, source/drain electrodes 402 and 401 are formed on the barrier layer 3, and the drain electrode 401 is electrically connected with the conductive bridge extension 2a via the through hole. Subsequently, a semiconductor layer 5, a gate insulating layer 6, a gate electrode 7 and a passivation layer 8 are formed in sequence, and hence the TFT structure is obtained.

Figure 5:
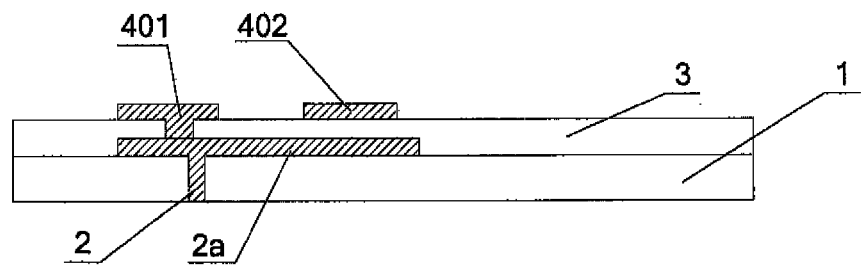
FIG. 5 is view 4 illustrating a schematic structure of the device in the method for manufacturing the array substrate, according to an embodiment of the present invention.

The step S3 can be achieved by the following means: as illustrated in FIG. 5, a $SiO_2$ layer with the thickness of 50 nm is deposited on the surface of the conductive bridge by sputtering or chemical vapor deposition (CVD), or organic resin material is deposited by spin-coating, and is photolithography etched and cured, and hence the barrier layer 3 with the thickness of 2 micrometers is obtained. Subsequently, a through hole structure is formed in the barrier layer 3 by a patterning process, and a metal layer with the thickness of 200 nm is deposited by sputtering at a corresponding position on the upper portion of the through hole. The metal layer usually may be made of metal such as molybdenum, aluminum, alloy of molybdenum and tungsten, chromium and copper, and can also adopt a combined structure of films made from the foregoing materials. In the embodiment, a double metal layer made from molybdenum and titanium is adopted, and the source/drain electrodes 402 and 401 are formed by a patterning process. The drain electrode 401 is formed on a corresponding through hole and electrically connected with the conductive bridge extension 2a.

Figure 6:
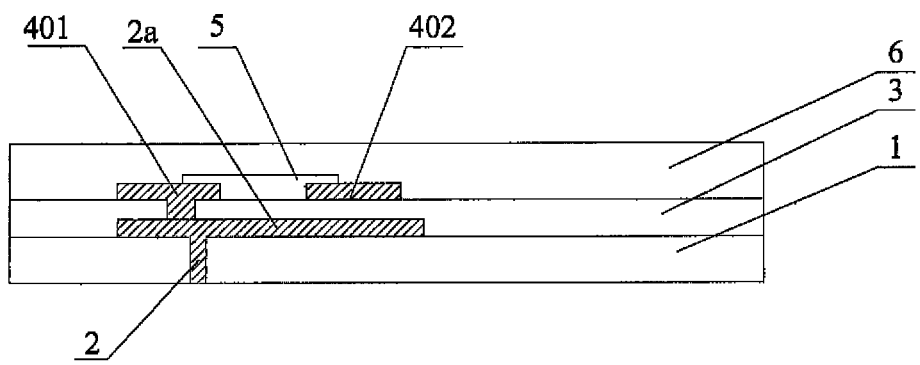
FIG. 6 is view 5 illustrating a schematic structure of the device in the method for manufacturing the array substrate, according to an embodiment of the present invention.
Figure 7:
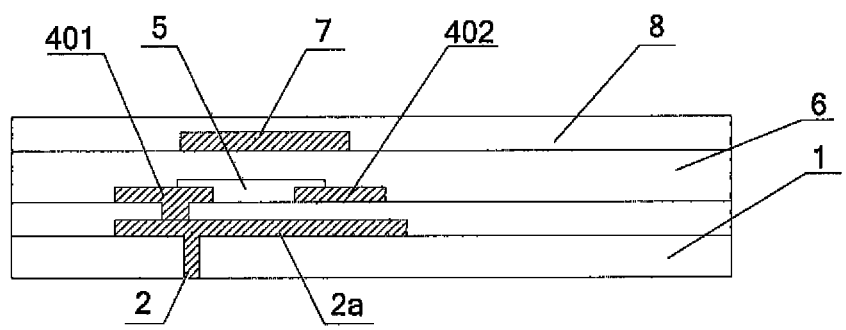
FIG. 7 is view 6 illustrating a schematic structure of the device in the method for manufacturing the array substrate, according to an embodiment of the present invention.

Moreover, as illustrated in FIG. 6, an IGZO film layer with a thickness of 50nm is deposited by sputtering; annealing is performed for 1 hour at 400° C. in pure oxygen environment; and the semiconductor layer 5 is formed by a patterning process. Furthermore, SiO2 and SiNx with a thickness of 120nm are deposited at the temperature of less than 390° C. by CVD and acts as a gate insulating layer 6. Subsequently, as illustrated in FIG. 7, metal with a thickness of 200nm is deposited by sputtering. The metal can usually adopt molybdenum, aluminum, alloy of molybdenum and tungsten, chromium or copper and can also adopt a combined structure of films made from the foregoing materials. In the embodiment, metal chromium is adopted; the gate electrode 7 is formed by a patterning process; and a passivation layer 8 made from PVX material is formed on the outside of the gate electrode 7. At this point, the TFT structure of the array substrate is formed.

Step S4: forming an OLED device on the other side of the base substrate, the OLED device connected with the conductive bridge in the through hole, and thus, an array substrate is obtained.

In the step, the OLED device is directly formed on the surface of the base substrate 1. Treatment on the surface of a pixel electrode is saved, thereby the manufacturing process can be accelerated and the manufacturing cost can be reduced with respect to conventional OLED display devices.

Figure 8:
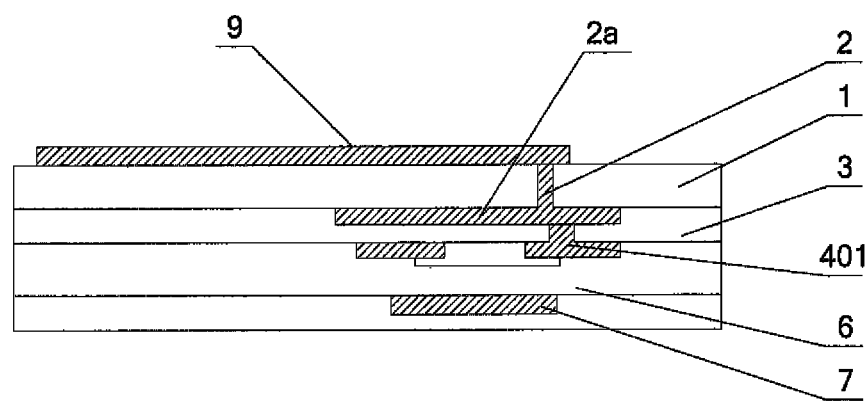
FIG. 8 is view 7 illustrating a schematic structure of the device in the method for manufacturing the array substrate, according to an embodiment of the present invention.
Figure 9:
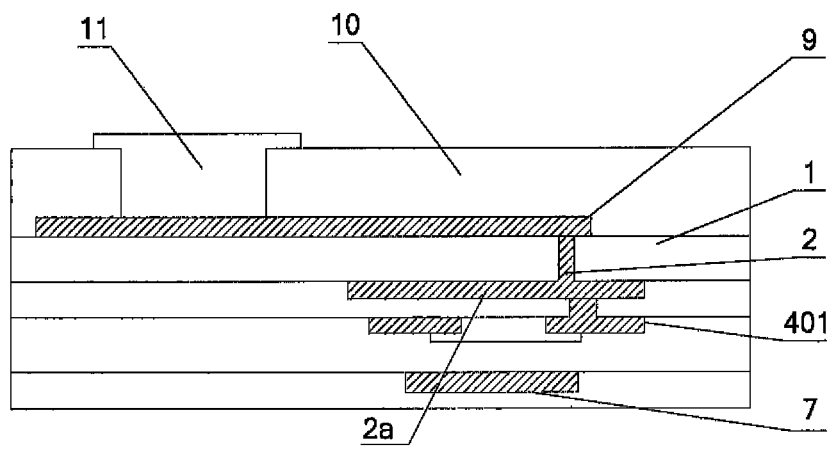
FIG. 9 is view 5 illustrating a schematic structure of the device in the method for manufacturing the array substrate, according to an embodiment of the present invention.

The step S4 is performed as follows: as illustrated in FIG. 8, a cathode 9 is formed on the surface of the base substrate and connected with the drain electrode 401 of the TFT structure through the conductive bridge 2 and the conductive bridge extension 2a; and as illustrated in FIG. 9, a luminous sheet 11 and an anode 12 are formed on the cathode 9 in sequence, wherein both the cathode 9 and the anode 12 are made from transparent conductive material.

Or, an anode is formed on the surface of the base substrate and connected with the drain electrode of the TFT structure through the conductive bridge, and subsequently a luminous sheet and a cathode are formed on the anode in sequence.

As illustrated in FIG. 8, a cathode 9 is formed on the other side of the base substrate 1 opposite to the TFT structure and connected with the conductive bridge 2 in the through hole of the base substrate. As the surface of the base substrate 1 is provided with a planarization structure, the method saves the surface treatment of the pixel electrode and hence the production difficulty is reduced and the manufacturing cost is saved. As illustrated in FIG. 9, an insulating layer 10 is formed on the cathode 9; subsequently, the insulating layer 10 is subject to exposing, developing and etching; an opening portion is formed on a portion of the base substrate 1 not corresponding to the TFT structure, so as to expose a portion of the cathode; a luminous sheet 11 is formed on the opening portion; the luminous sheet 11 can be disposed at a position not corresponding to the source electrode 402, the drain electrode 401 or the gate electrode 7 in the TFT structure; thus, light emitted from the luminous sheet 11 can be emitted in two directions perpendicular to the base substrate; and hence the double-sided display of the array substrate can be achieved. An anode 12 is formed on the insulating layer provided with the luminous sheet 11, and thereby the array substrate structure as illustrated in FIG. 1 is finally formed.

Apart from the advantages mentioned in the above embodiments, in the embodiment, an OLED device can also be directly formed on the base substrate. Surface treatment of the pixel electrode is saved, and hence the manufacturing process can be accelerated and the manufacturing cost can be reduced with respect to conventional OLED display devices.

Still another embodiment of the present invention further provides a display device such as a mobile phone, a tablet PC, a display and a TV, which comprises the foregoing array substrate.

The foregoing are merely exemplary embodiments of the invention, but are not used to limit the protection scope of the invention. The protection scope of the invention shall be defined by the attached claims.

The invention claimed is:

1. A method for manufacturing an array substrate, comprising:
forming a through hole on a base substrate which passes through the base substrate, and forming a conductive bridge in the through hole, forming a conductive bridge extension on one side of the base substrate provided with a thin film transistor structure, the conductive bridge extension and the conductive bridge formed integrally;

forming a barrier layer on the one side of the base substrate provided with the conductive bridge extension, and forming a through hole in the barrier layer;

forming the thin film transistor structure on the barrier layer; and forming an organic light emitting diode device on the other side of the base substrate, the organic light emitting diode device connected with the thin film transistor structure through the conductive bridge;

wherein both an entire surface of the one side of the base substrate and an entire surface of the other side of the base substrate are planar surfaces; and wherein forming a through hole on a base substrate which passes through the base substrate comprises:

performing photoresist coating, exposure and development on both surfaces of the base substrate in sequence, thus forming a photoresist layer on each surfaces of the base substrate respectively, in which the photoresist layer has patterns of holes with same dimension at corresponding positions; and etching the base substrate and removing photoresist, thereby forming a through hole perpendicular to the surface of the base substrate.

2. The method according to claim 1, wherein forming a thin film transistor structure on one side of the base substrate comprises:

forming source/drain electrodes, the drain electrode electrically connected with the conductive bridge extension via the through hole; and forming a semiconductor layer, a gate insulating layer, a gate electrode and a passivation layer in sequence.

3. The method according to claim 1, wherein before etching the base substrate, the method further comprises:

adding a hydrofluoric acid solution to the surface of the base substrate, so as to etch the base substrate.

4. The method according to claim 1, wherein forming an organic light emitting diode device on the other side of the base substrate, the organic light emitting diode device connected with the thin film transistor structure through the conductive bridge comprises:

forming a cathode on the surface of the base substrate, the cathode connected with the thin film transistor structure via the through hole, and forming a luminous sheet and an anode in sequence;

or forming an anode on the surface of the base substrate, the anode connected with the thin film transistor structure via the through hole, and forming a luminous sheet and a cathode in sequence;

wherein the luminous sheet does not overlap the thin film transistor structure in a direction perpendicular to the base substrate.

* * * * *